United States Patent
Malisani

(10) Patent No.: US 12,393,745 B2
(45) Date of Patent: Aug. 19, 2025

(54) METHOD FOR CONSTRUCTING A WIND FARM IN A PREDETERMINED SPACE

(71) Applicant: IFP Energies nouvelles, Rueil-Malmaison (FR)

(72) Inventor: Paul Malisani, Rueil-Malmaison (FR)

(73) Assignee: IFP ENERGIES NOUVELLES, Rueil-Malmaison (FR)

(*) Notice: Subject to any disclaimer, the term of this patent is extended or adjusted under 35 U.S.C. 154(b) by 245 days.

(21) Appl. No.: 18/007,184

(22) PCT Filed: Jul. 15, 2021

(86) PCT No.: PCT/EP2021/069748
§ 371 (c)(1),
(2) Date: Jan. 27, 2023

(87) PCT Pub. No.: WO2022/028847
PCT Pub. Date: Feb. 10, 2022

(65) Prior Publication Data
US 2023/0237208 A1    Jul. 27, 2023

(30) Foreign Application Priority Data
Aug. 6, 2020   (FR) ...................... 2008341

(51) Int. Cl.
*F03D 13/10* (2016.01)
*G06F 30/13* (2020.01)
(52) U.S. Cl.
CPC ............. *G06F 30/13* (2020.01); *F03D 13/10* (2016.05)

(58) Field of Classification Search
CPC .......... G06F 30/13; F03D 13/10; F03D 13/30; F03D 7/048; F05B 2260/84;
(Continued)

(56) References Cited

U.S. PATENT DOCUMENTS

2023/0086699 A1* 3/2023 Machefaux ........... F03D 80/002
703/18

FOREIGN PATENT DOCUMENTS

CN        105119320 A    12/2015

OTHER PUBLICATIONS

Song M X et al: "Optimization of Wind Farm Micro-siting for Complex Terrain Using Greedy Algorithm", Energy, Elsevier, Amsterdam, NL, vol. 67, (Feb. 14, 2014), pp. 454-459.
(Continued)

*Primary Examiner* — Aaron R Eastman
(74) *Attorney, Agent, or Firm* — Fitch, Even, Tabin & Flannery LLP

(57) ABSTRACT

The invention is a method of constructing a wind farm from a predefined number of wind turbines in a predetermined space. This method comprises two discrete distributions (RD1, RD2), one for the wind speed and one for the wind direction, and a first discrete grid (RD3) of the predetermined space. The method also comprises the probability of occurrence (Prob) of each discrete wind speed value in each discrete wind direction. This method uses a first wind turbine arrangement in the predetermined space, then the position of the wind turbines is modified, one by one (i), by determining discrete positions (PDP_i) around the position to be modified. The position selected (Pos_i) is the one allowing the annual energy produced by the wind farm to be maximized.

20 Claims, 9 Drawing Sheets

(58) Field of Classification Search
CPC .. F05B 2260/8211; Y02E 10/72; Y02E 40/70; Y04S 10/50; G06Q 50/06; G06Q 10/06312

See application file for complete search history.

(56) References Cited

OTHER PUBLICATIONS

Wang Yong et al: "Differential Evolution With a New Encoding Mechanism for Optimizing Wind Farm Layout", IEEE Transactions on Industrial Informatics, IEEE Service Center, New York, NY, US, vol. 14, No. 3, Mar. 1, 2018.

Chunqiu Wan et al: "Wind Farm Micro-siting by Gaussian Particle Swarm Optimization With Local Search Strategy". Renewable Energy, Pergamon Press, Oxford, GB, vol. 48, Apr. 28, 2012, 11 pages.

Gonzalez JS et al: "Optimization of Wind Farm Turbines Layout Using an Evolutive Algorithm". Renewable Energy, Pergamon Press, Oxford, GB, vol. 35, No. 8, (Aug. 1, 2010). pp. 1671-1681.

Bansal Jagdi Sh Chand et al: "Wind Farm Layout Using Biogeography Based Optimization". Renewable Energy, vol. 107, (Jan. 1, 2017), pp. 386-402.

Wagner, et al.: "A Fast and Effective Local Search Algorithm for Optimizing the Placement of Wind Turbines", Renewable Energy, Oct. 10, 2012, 7 pages.

Tao, et al.: "Wind Farm Layout Optimization With a Three-dimensional Gaussian Wake Model", Renewable Energy, Jun. 9, 2020, 17 pages.

Quan et al.: "Greedy Robust Wind Farm ILayout Optimization With Feasability Guarantee", Engineering Optimization, Sep. 6, 2018, 17 pages.

Feng, et al.: "Solving the Wind Farm Layout Optimization Problem Using Random Search", Renewable Energy, Jan. 20, 2015, 11 pages.

Antonini, et al.: "Continuous Adjoint Formulation for Wind Farm Layout Optimization", Applied Energy, Jul. 25, 2018, 13 pages.

International Search Report for PCT/EP2021/069749 dated Jul. 15, 2021; 5 pages.

\* cited by examiner

[Fig 1]
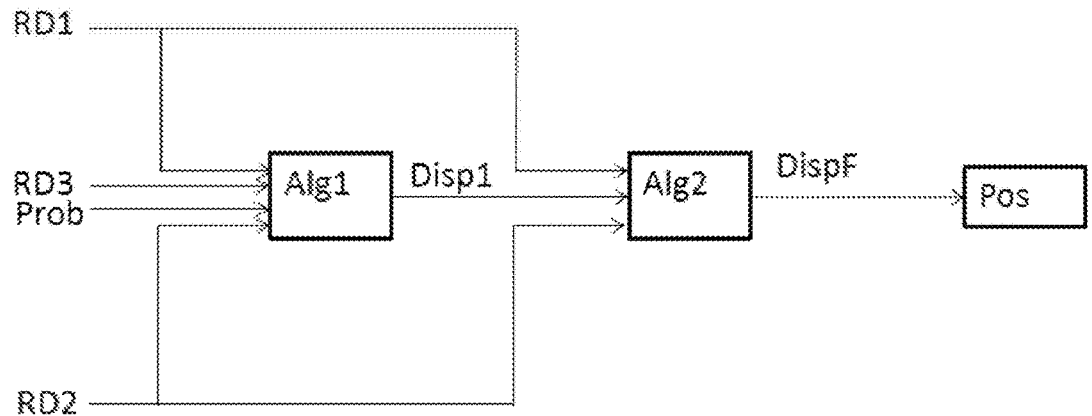
[Fig 2]
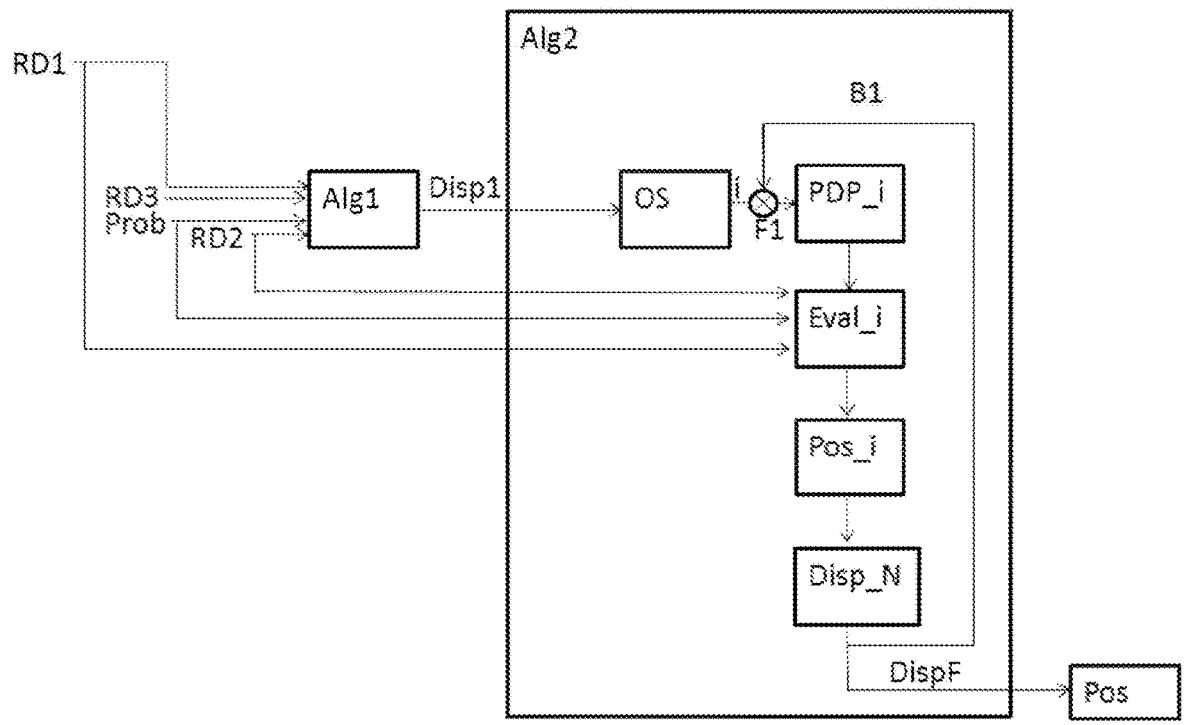

[Fig 3]
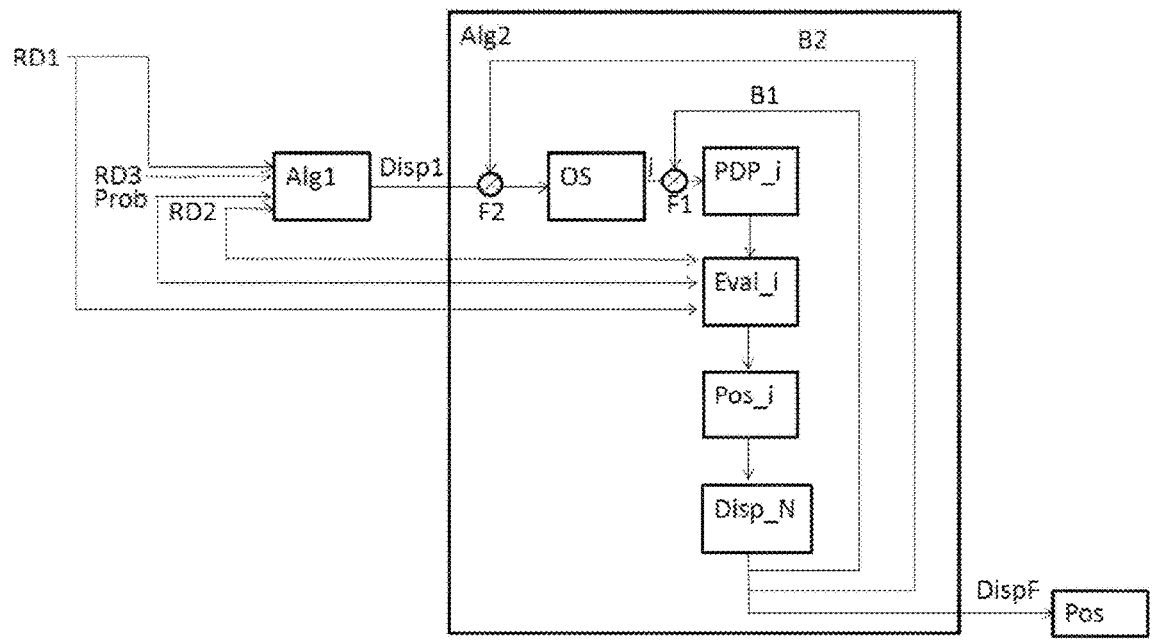
[Fig 4]
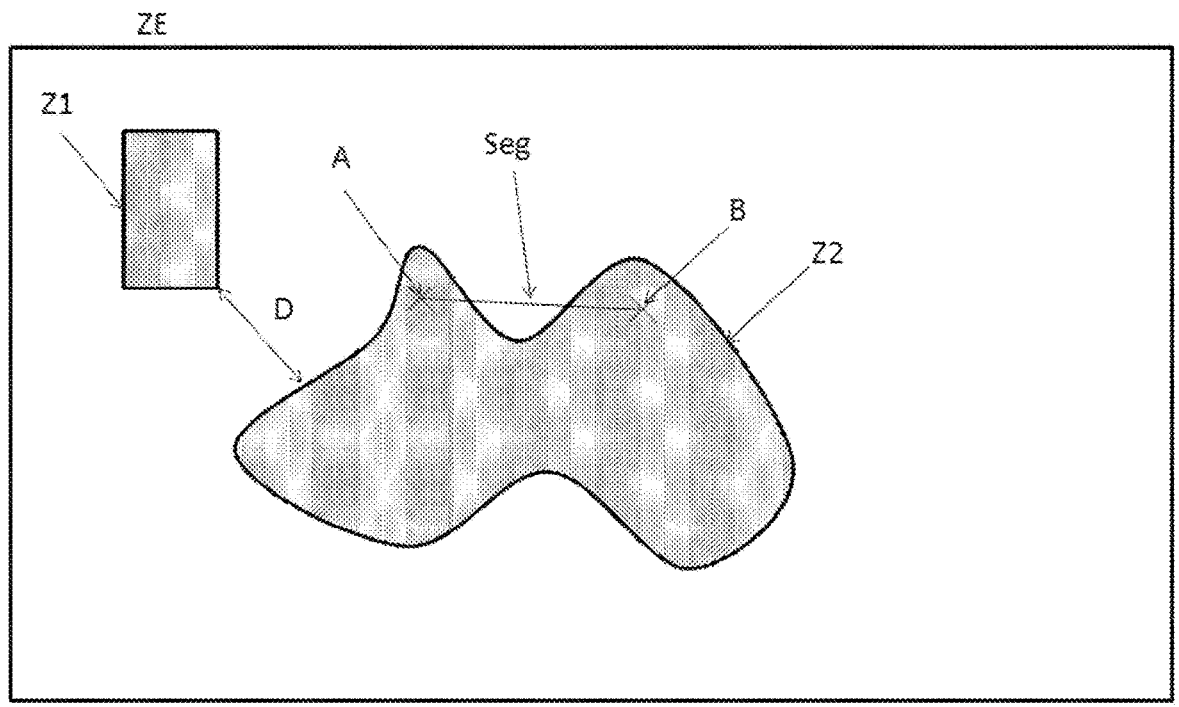

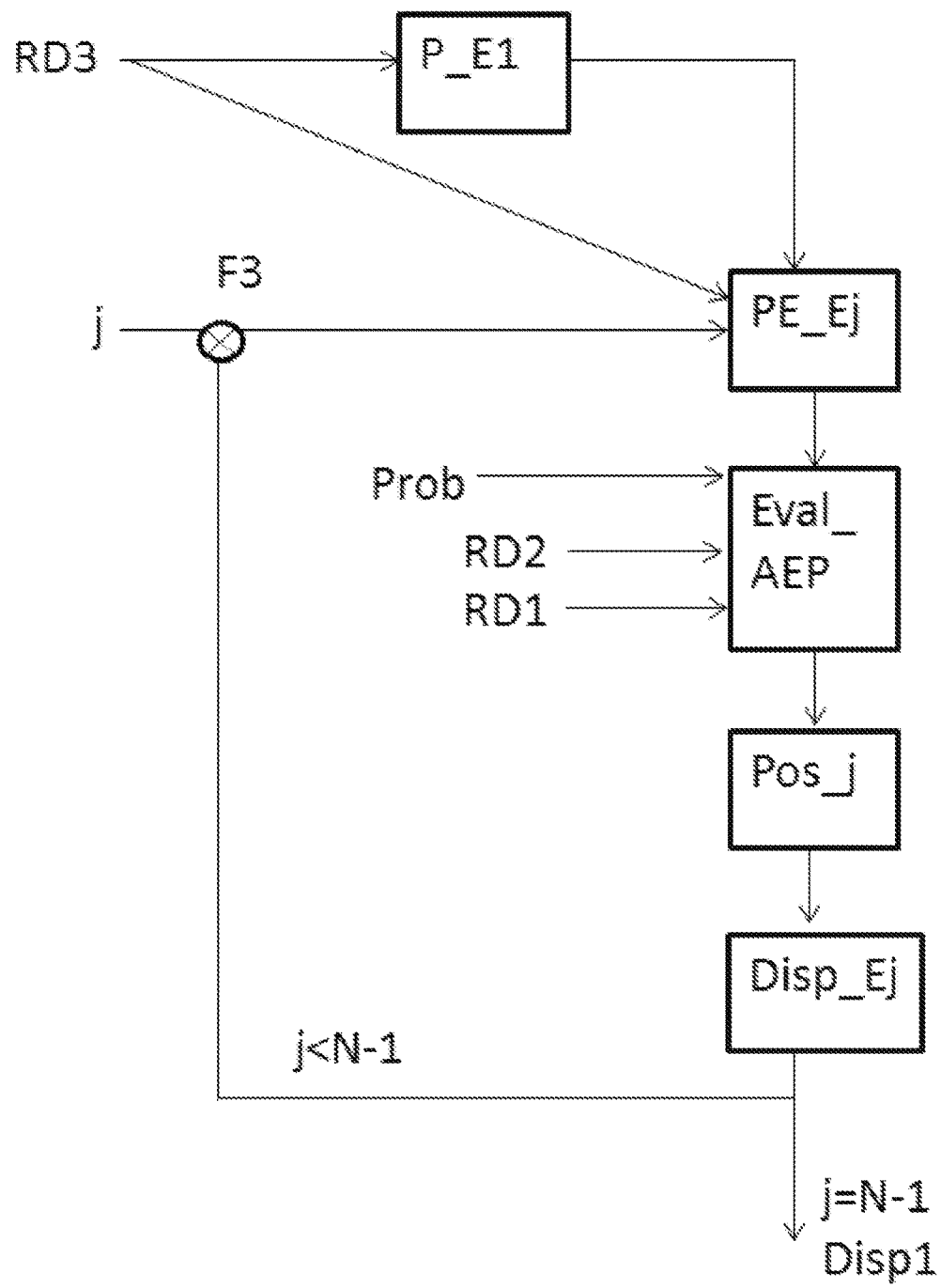
[Fig 5]

[Fig 6]
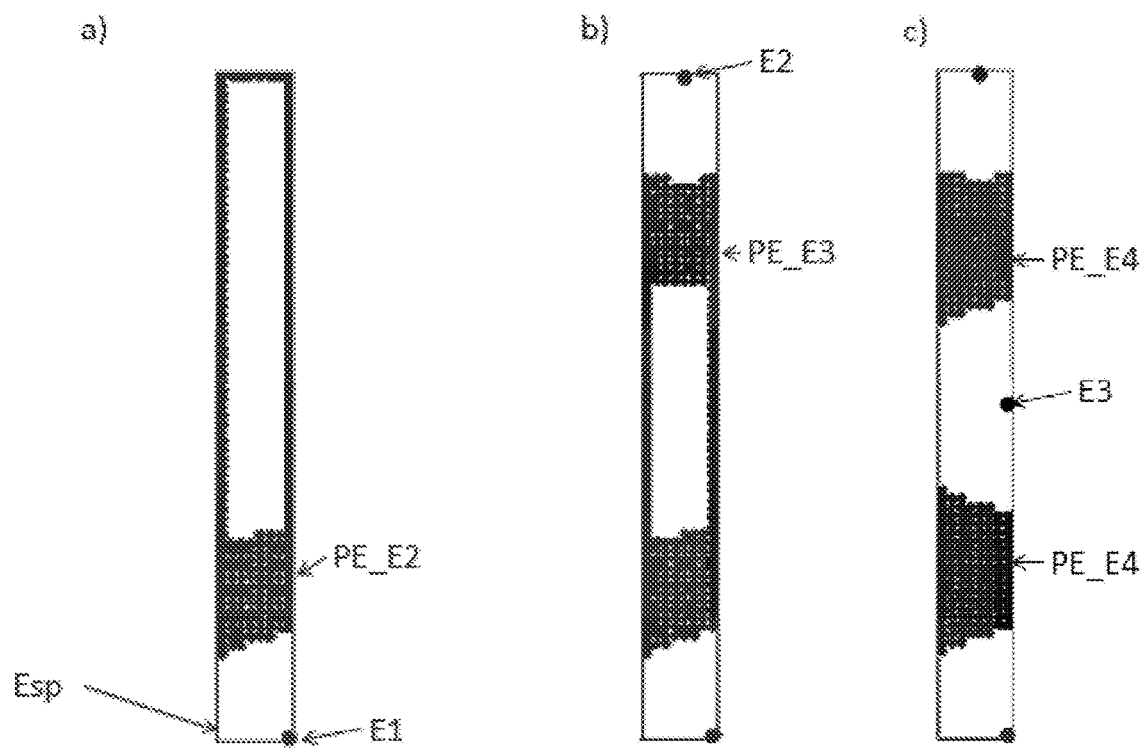

[Fig. 7]
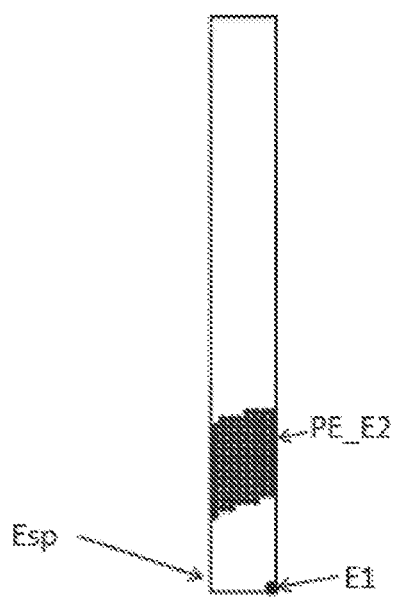 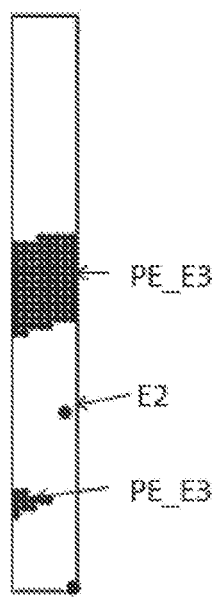 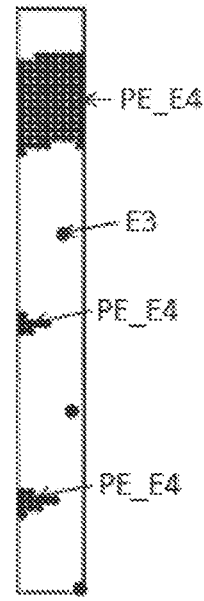

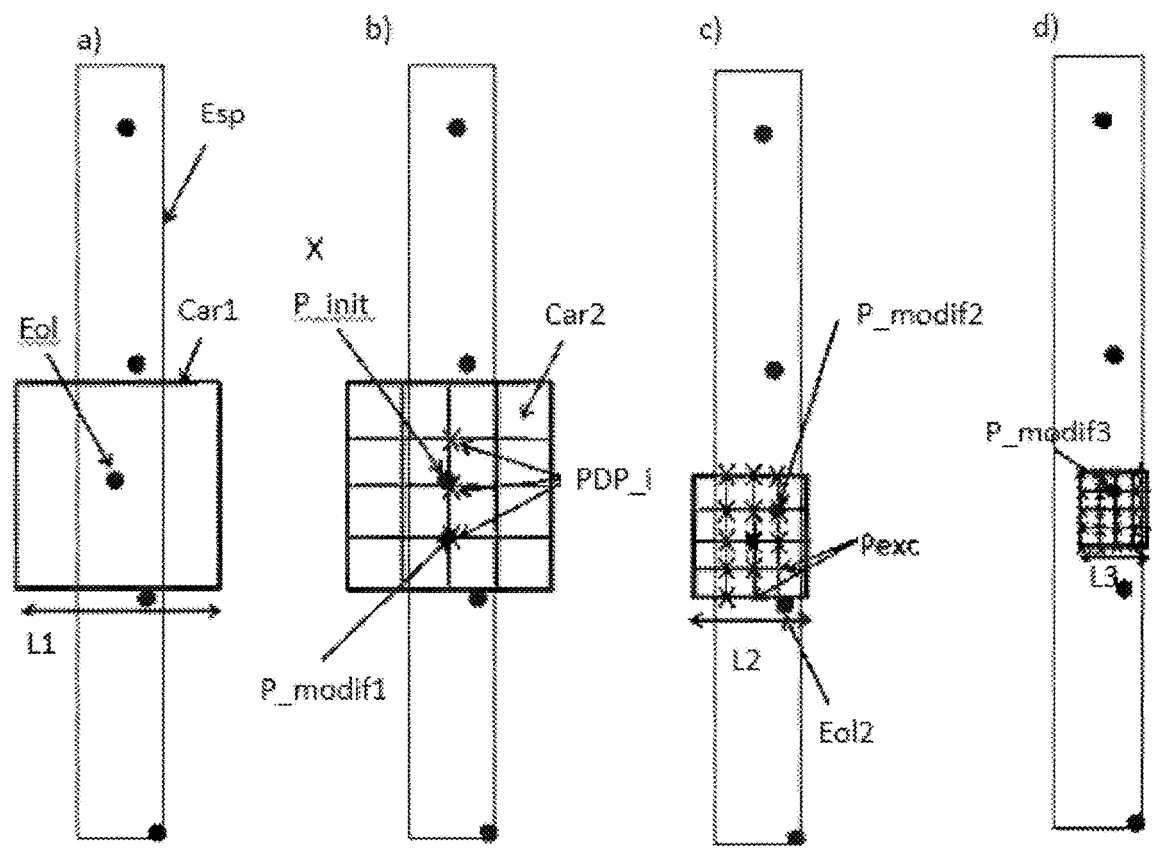
[Fig 8]

[Fig 9]
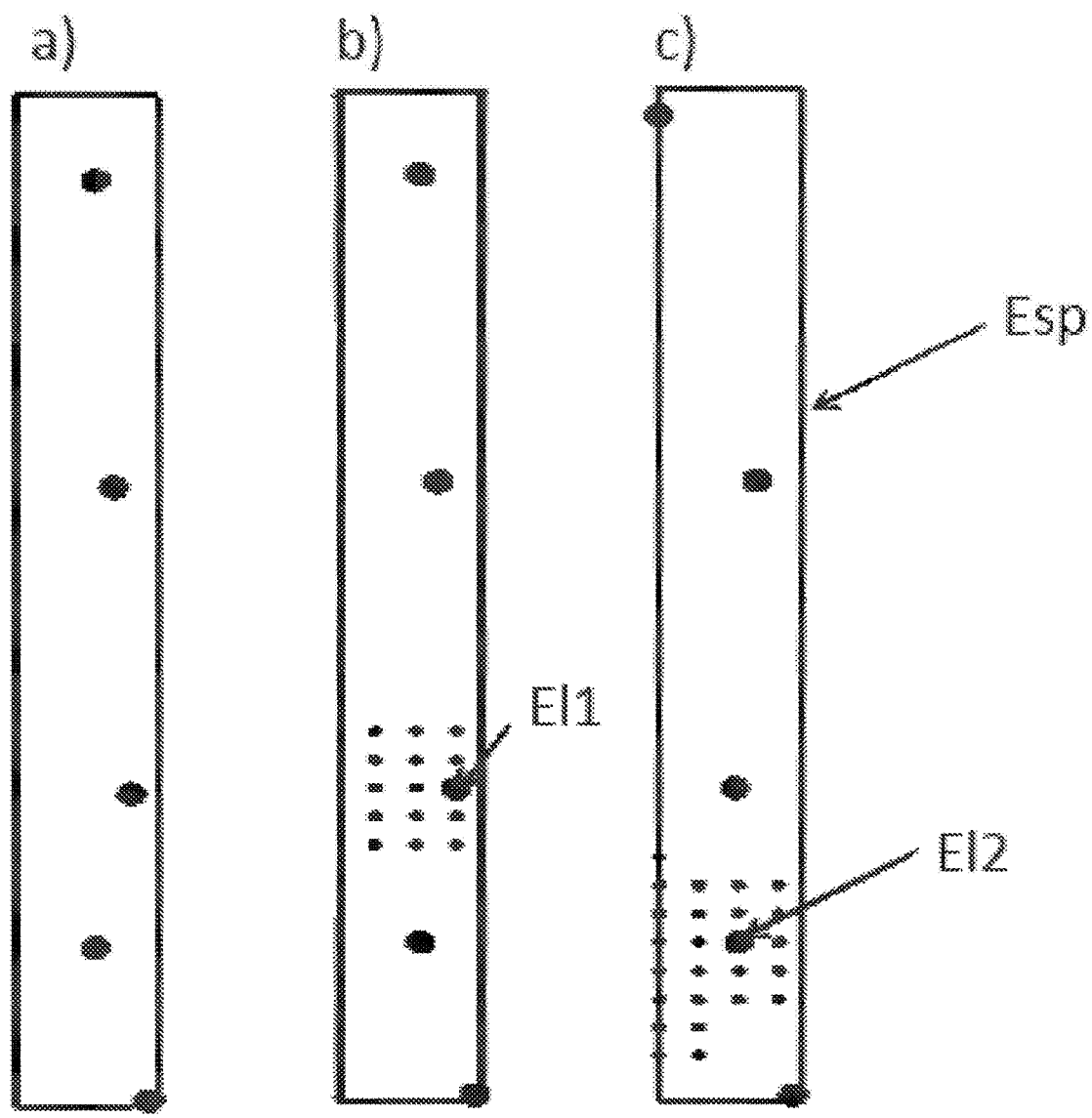

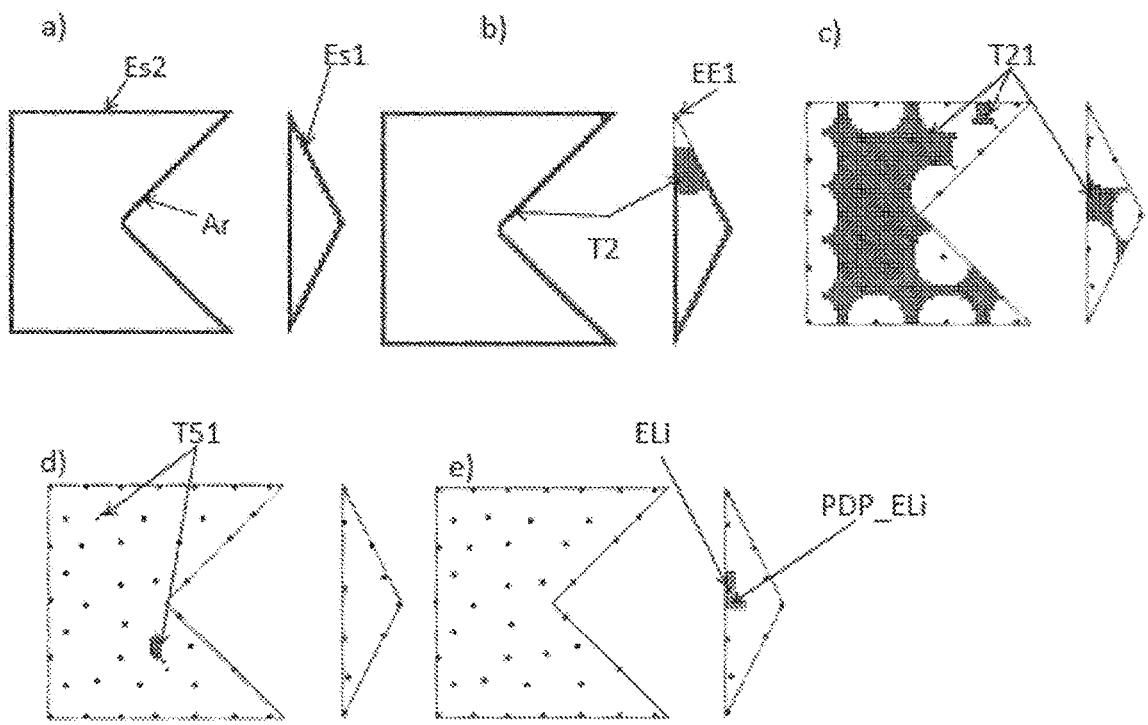
[Fig 10]

[Fig. 11]
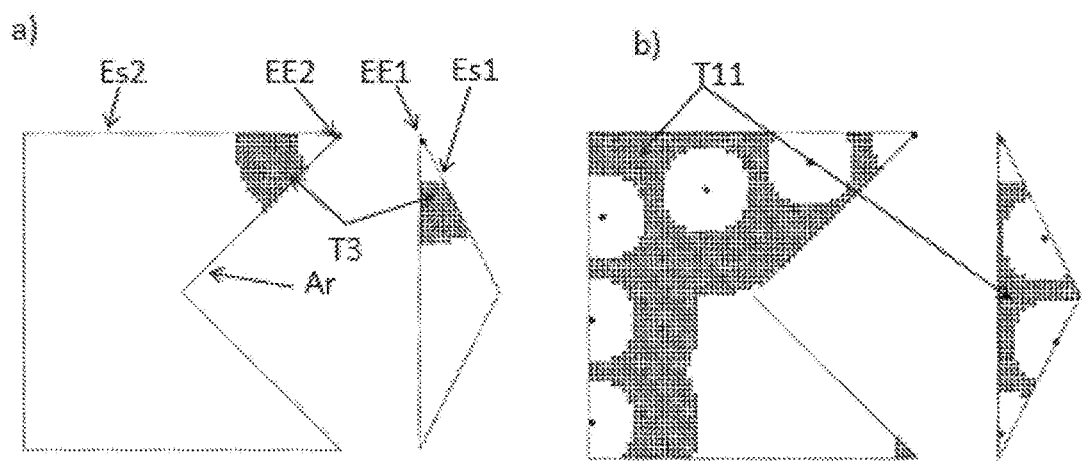

METHOD FOR CONSTRUCTING A WIND FARM IN A PREDETERMINED SPACE

CROSS-REFERENCE TO RELATED APPLICATIONS

Reference is made to PCT/EP2021/069748 filed Jul. 15, 2021, and French Patent Application No. 2008341 filed Aug. 6, 2020, which are incorporated herein by reference in their entirety.

BACKGROUND OF THE INVENTION

Field of the Invention

The present invention relates to a method of constructing a wind farm in a predetermined space.

Description of the Prior Art

Wind farms have appeared to meet environmental challenges. These wind farms are made up of several wind turbines spaced apart from each other in a delimited space. This delimited space can be on land or at sea. A distinction is thus made between onshore wind farms and offshore wind farms, that is at sea.

The wind turbines of these farms are generally horizontal-axis wind turbines provided with a system for orienting the horizontal axis of rotation in the direction of the wind, so as to maximize the energy recovered by the turbine. Sometimes, the wind turbine is designed to automatically orient itself in the direction of the wind.

Vertical-axis wind turbines are also known, which have the advantage of not requiring orientation in the direction of the wind.

In wind farms, the wakes generated by the turbines can have the effect of reducing the wind speed downstream from the turbine, and therefore the energy recovered by other turbines, notably those located downstream from those generating these wakes. The position of the wind turbines in the farm is thus important for maximizing the energy recovered by the farm.

In a location selected for setting up a wind farm, the local wind characteristics may vary. Indeed, the wind direction and speed are notably parameters that may vary over time in the location considered. These characteristics can notably be obtained by sensors positioned in the defined location and maintained in this position for several months or several years to obtain sufficient statistical data for characterizing the wind resource in the selected location. These sensors may notably be anemometers positioned at a sufficient altitude (of the order of 100 m above ground) for characterizing the wind experienced by the turbines (i.e. the wind that is substantially at the level of the rotor axis for example). The wind data can also be obtained using the LiDAR (Light Detection And Ranging) technology.

Statistical knowledge of the wind in the location considered for the farm notably allows obtaining the wind speed distribution, the wind direction distribution and the joint probability of occurrence of a wind speed in a given direction.

In order to maximize the annual energy produced by the farm, it is therefore necessary to position the turbines in an optimal manner in the location planned for the farm.

The "annual energy produced" or the "annual energy production" is understood to be the total average energy produced by the farm, therefore by all the wind turbines of the farm. This average energy, estimated by taking account of the statistical wind data (wind speed and wind direction distributions, probabilities of occurrence), is based on a period of one year, hence the term "annual", so as to avoid a seasonal influence that might distort the results. Indeed, the wind, whatever the speed or the direction thereof, can vary greatly depending on the season.

The average energy is obtained by knowing the wind direction distribution, the wind speed distribution and the probability of occurrence of a wind speed in a given direction.

Of course, the annual energy produced also depends on the wind turbines selected.

Several methods have been developed to determine the correct positioning of wind turbines in the location selected for the farm.

Patent application CN-105,119,320 relates to a method based on an evolutionary algorithm. This type of algorithm is stochastic, using random processes. This type of algorithm requires a large number of tests in order to obtain a result, which generates significant computing time and therefore requires a large computer memory.

Patent applications CN-102,142,103A, CN-105,139,269 and US-2016-171,401 relate to wind turbine positioning methods based on genetic algorithms. Genetic algorithms are a category of evolutionary algorithms. They require a multitude of evaluations and cross-checks of these evaluations from the possible (continuous) real data. Genetic algorithms are therefore complex and they require significant computing time, as well as a large computer memory.

The methods described in the following documents are also known:

"Wind Farm Layout Optimization with a Three-Dimensional Gaussian Wake Model", Tao et al., Renewable Energy, Jun. 9, 2020. This method needs the planned farm location to be delimited by a rectangle. In other words, this method is not suitable for farms comprising non-convex or even non-connex spaces;

"Continuous Adjoint Formulation for Wind Farm Layout Optimization", Antonini et al., Applied Energy, Jul. 25, 2018. This method is based on an analytical method of evaluating wake effects. This method is therefore a continuous optimization method based on CFD (Computational Fluid Dynamics) computations, which requires long computing times and a large computer memory;

"A fast and Effective Local Search Algorithm for Optimizing the Placement of WindTurbines", Wagner and al, Renewable Energy, Oct. 10, 2012. Application of this method requires locations delimited by a rectangle. It is therefore not suitable for locations with non-convex or non-connex shapes;

"Solving the Wind Farm Layout Optimization Problem Using Random Search", Feng & Shen, Renewable Energy, Jan. 20, 2015. This method requires locations delimited by polyhedra. It is therefore not suitable for locations with non-connex shapes; and "Greedy Robust Wind Farm Layout Optimization with Feasability Guarantee", Quan and Kim, Engineering Optimization, Sep. 6, 2018. This method is based on a greedy algorithm that takes account of all the positions located at a minimum distance from the wind turbines already positioned in the location for determining the location of the next turbine. It therefore requires a long computing time and a large computer memory, notably if the discretization of the location selected for the farm is fine, if the space in which the wind turbines are to be placed is large and/or if the number of turbines to be positioned is large.

Thus, the technical problem to be solved by the invention is developing a method of constructing a wind farm enabling optimal positioning of wind turbines in locations of complex shape, such as non-convex and/or non-connex zones, so as to maximize the total energy produced by the wind farm, while minimizing the required computing time and the computer memory.

SUMMARY OF THE INVENTION

The invention therefore relates to a method of constructing a wind farm from a predefined number of wind turbines in a predetermined space, the construction method comprising a first discrete wind speed distribution, a second discrete wind direction distribution and a probability of occurrence of each wind speed value and each wind direction value of the first and second discrete distributions. In addition, the predetermined space is split into a first discrete grid. The method comprises at least the following successive steps:
  a) determining a first wind turbine arrangement in the first discrete grid of the predetermined space by a first positioning algorithm,
  b) defining a sequential order of modification of the wind turbine positions determined by the first positioning algorithm, then carrying out at least the following steps iteratively, for at least one wind turbine to be repositioned, one by one, in the sequential order defined:
    b1) determining, for each wind turbine to be repositioned, new possible discrete positions of the turbine to be repositioned;
    b2) calculating the average annual energy production of the predefined number of wind turbines for each possible discrete position of the wind turbine to be repositioned, from the first discrete wind speed distribution, the second discrete wind direction distribution and the probability of occurrence;
    b3) selecting the position of the wind turbine to be repositioned corresponding to the calculated maximum value of the annual energy production and placing the turbine to be repositioned at the selected position;
    b4) defining a new arrangement of the wind turbines in the predetermined space corresponding to the arrangement where only the turbine to be repositioned has been moved according to state b3); and
  c) determining a final position corresponding to the last arrangement obtained.

The wind farm is subsequently constructed by erecting (setting up/constructing) the wind turbines (the predefined number of wind turbines) in the determined positions of the final arrangement in the physical site of the predetermined space to produce energy, electricity for example, from wind.

The invention also relates to a computer program product implementing the method defined above, and to a wind farm obtained using the method defined above.

The invention relates to a method of constructing a wind farm, the method of constructing a wind farm comprising a first discrete wind speed distribution, a second discrete wind direction distribution and a probability of occurrence of each discrete wind speed value in each discrete wind direction value of the first and second discrete distributions, the predetermined space being split into a first discrete grid. At least the following successive steps are carried out in this method:
  a) determining a first arrangement of the wind turbines in the first discrete grid of the predetermined space by a first positioning algorithm,
  b) defining a sequential order of modification of the wind turbine positions determined by the first positioning algorithm, then carrying out at least the following steps iteratively, for at least one wind turbine to be repositioned, one by one, in the sequential order defined:
    b1) determining, for each wind turbine to be repositioned, new possible discrete positions of the turbine to be repositioned, by developing a grid of at least a first predefined length, the grid being centered on the position of the turbine to be repositioned, the grid being split into a pre-established number of cells, the new possible discrete positions comprising the points of intersection of the cells, the points of intersection of the cells being positioned in the predetermined space and at a minimum distance from the positions of the other wind turbines;
    b2) calculating the average annual energy production of the predefined number of wind turbines for each possible discrete position of the wind turbine to be repositioned, from the first discrete wind speed distribution, the second discrete wind direction distribution and the probability of occurrence;
    b3) selecting the position of the wind turbine to be repositioned corresponding to the calculated maximum value of the annual energy production calculated in step b2);
    b4) defining a new arrangement of the wind turbines in the predetermined space;
  c) determining a final position corresponding to the last arrangement obtained and constructing the wind farm by erecting the predefined number of wind turbines in the determined positions of the final arrangement in the physical site of the predetermined space to produce electricity from wind.

According to an implementation of the invention, prior to step a), statistical wind data is collected by collection devices, preferably a LiDAR sensor, in the predetermined space in order to determine the first and second discrete distributions, and the probabilities of occurrence of each wind speed in each wind direction of the first and second discrete distributions.

According to a configuration, the predetermined space is two-dimensional.

Preferably, the sequential order is randomly obtained.

Preferably, step b) is reiterated several times by modifying the sequential order upon each iteration.

More preferably, for each iteration of step b), a first predefined length less than the first predefined length of the previous iteration is selected, the predefined number being the same from one iteration to another, and the iteration of step b) is stopped when the first predefined length becomes less than a first threshold value.

According to an implementation of the invention, the predetermined space comprises non-connex zones.

According to a variant of the invention, the predetermined space comprises non-convex zones.

Advantageously, the first positioning algorithm performs at least the following steps:
  defining arbitrarily (randomly) the position of the first wind turbine;
  then, for each wind turbine to be positioned, successively:
    defining potential positions in the first discrete grid for the wind turbine to be positioned, the potential positions comprising the discrete positions of the first discrete grid located between at least one of a minimum distance and a maximum distance from all the positioned turbines and the discrete positions of the boundary of the predetermined space located at the minimum distance from all the positioned turbines;

calculating the annual energy production of the positioned wind turbines and of the turbine to be positioned for the potential positions defined, from the first discrete wind speed distribution, the second discrete wind direction distribution and the probability of occurrence;

selecting the position of the wind turbine to be positioned corresponding to the calculated maximum annual energy production value; and determining the first arrangement corresponding to the position of the predefined number of wind turbines in the predetermined space.

According to an embodiment of the invention, the arbitrary position corresponds to the largest sum of the coordinates of the positions of the first discrete grid.

The invention also relates to a computer program product implementing the method described by a computer.

Furthermore, the invention also relates to a wind farm obtained from the method of constructing a wind farm as described above.

BRIEF DESCRIPTION OF THE DRAWINGS

Other features and advantages of the method and the systems according to the invention will be clear from reading the description hereafter of embodiments given by way of non-limitative example, with reference to the accompanying figures wherein:

FIG. 1 is an overall view of the various steps of positioning methods according to the invention;

FIG. 2 is a detailed view of the various steps of a first method of constructing a wind farm according to the invention;

FIG. 3 is a detailed view of the various steps of a second method of constructing a wind farm according to the invention;

FIG. 4 illustrates an example of a complex location for positioning wind turbines according to the invention;

FIG. 5 illustrates a variant of a first positioning algorithm according to the invention;

FIG. 6 illustrates a first example of application of a first positioning algorithm according to the invention;

FIG. 7 illustrates a second example of application of a first positioning algorithm according to the invention;

FIG. 8 illustrates the local search method for repositioning a turbine of the wind farm according to the invention;

FIG. 9 illustrates various steps of the local search method for repositioning a turbine of the wind farm according to the invention;

FIG. 10 illustrates various steps of the method of constructing a wind farm in a complex location comprising non-connex zones and a non-convex zone; and FIG. 11 illustrates a variant of the method of constructing a wind farm for the same complex location as in FIG. 10.

DETAILED DESCRIPTION OF THE INVENTION

In order to make understanding of the present description easier, some definitions are explained hereafter.

A "greedy algorithm" is understood to be an algorithm that develops a local optimum step by step. In the case of a wind farm, it positions each turbine one after the other, until all the wind turbines are positioned in the predetermined space.

An "evolutionary algorithm" is understood to be a bio-inspired algorithm that evolves a set of solutions for obtaining better results. It is therefore stochastic and uses random processes iteratively.

A "genetic algorithm" is understood to be an evolutionary algorithm using natural selection. This type of algorithm can notably combine or modify some parameters of previous solutions so as to improve results.

"Non-connex zones" are understood to be zones where there are at least two points that cannot be connected by a continuous path entirely contained in the zone in question. On the other hand, a "connex zone" is a zone where each pair of points is connected by a continuous path entirely contained in the zone.

A "convex zone" is understood to be a zone where the segments connecting any two points of this zone are all entirely contained in the zone such as a circle, a square or a rectangle delimiting convex zones for example.

Conversely, a "non-convex zone" is a zone where there are at least two points connected by a segment that is not entirely contained in the zone. For example, a zone delimited by a concentric outer circle and inner circle is not convex.

The invention relates to a method of positioning a predefined number of wind turbines in a predetermined space or to a method of constructing a wind farm, the method of positioning or of constructing a wind farm comprises a first discrete wind speed distribution, a second discrete wind direction distribution and a probability of occurrence of each discrete wind speed value in each discrete wind direction value of the first and second discrete distributions, the predetermined space being split into a first discrete grid. A "discrete grid" is understood to mean that the predetermined space is split into pieces of rectangular or square shape for example, and the discrete grid is made up of the points determined by this grid. For example, the first discrete grid can be at least one of the points delimiting the pieces (the four points of each rectangular or square piece for example), and the points of intersection of the pieces, and of the centers of the grid cells (the center of the square or rectangular pieces for example).

Using discrete values for the wind speed, the wind direction and the discrete points of the first discrete grid of the predetermined space allows simplification of the method, to accelerate the computing time and to limit the required computer memory, compared to methods using continuous real data. Indeed, discrete values allow limiting the number of possible combinations (one speaks then of combination method) while continuous real data (one speaks then of continuous method) provides an infinity of solutions. Combining the first and second discrete distributions and the first discrete grid thus allows obtaining good precision in positioning the various wind turbines in the predetermined space while limiting the computing time required for determining the positions.

The probability of occurrence of each wind speed, in each wind direction, is notably used for calculating the average annual energy production. This probability can notably be obtained from a compass rose corresponding to the predetermined space, this compass rose being well known to the person skilled in the art. The compass rose can be generated using notably wind speed and wind direction collector, such as an anemometer positioned on a mast at a sufficient altitude (between 80 m and 120 m for example, which is substantially at the level of the wind turbine hub), or by using a LiDAR (Light Detection And Ranging) sensor positioned close to the ground and oriented vertically. This collector is kept in place for a long period, several months and ideally more than a year, to be able to account for the wind characteristics variations depending on the seasons. In other words, the method can comprise a step in which a collector such as an anemometer, a measuring mast or, more advantageously, a LiDAR sensor or any similar device is installed for a predetermined period in the physical site of the predetermined space in order to collect wind data at this site. The predetermined data collection period can be at least one year in order to have data relative to the four seasons. A step of statistical wind data collection can thus be provided from at least one collector.

At least the following successive steps are carried out in this method:
  a) determining a first arrangement of the wind turbines in the first discrete grid of the predetermined space by a first positioning algorithm. Preferably, this first positioning algorithm can be an optimization algorithm allowing obtaining a first distribution enabling a large annual energy production to be obtained. Advantageously, this first positioning algorithm can be a greedy algorithm that positions each wind turbine one after the other to maximize the annual energy produced. The first wind turbine can be arbitrarily positioned in the predetermined space (at a discrete value of the first discrete grid). The second wind turbine will be positioned in the discrete position of the first discrete grid allowing maximizing the annual energy production of the two turbines. The position selected for the n-th wind turbine corresponds to the discrete position of the first discrete grid allowing maximizing the annual energy production of the n turbines. Using a greedy algorithm allows obtaining, in a simple manner, a first arrangement of the wind turbines in the predetermined space, which allows initializing the local search optimization method of step b) below,
  b) defining a sequential order of modification of the wind turbine positions determined by the first positioning algorithm, then carrying out at least the following steps iteratively, for at least one wind turbine to be repositioned (preferably for all the wind turbines of the predefined number of turbines), one by one, in the sequential order defined:
   b1) determining, for each wind turbine to be repositioned, new possible discrete positions of the turbine to be repositioned, by developing a grid of at least a first predefined length (for example, the grid can be a first square whose first predefined length corresponds to the side of the first square), the grid being centered on the position of the turbine to be repositioned (the position of the turbine to be repositioned then corresponds to the center of the first square for example), the grid being split into a pre-established number of cells (the cells can be for example second squares), the new possible discrete positions comprising the points of intersection of the cells (of the second squares for example) positioned in the predetermined space and at a minimum distance from the positions of the other wind turbines. In other words, what is sought here are positions in the vicinity of the wind turbine to be repositioned, where the turbine could be installed. Positions too close to the other turbines and those outside the predetermined space (outside the zone provided for installation of the wind turbines) are therefore removed. Using the grid (first square for example) allows globally delimiting the vicinity of the turbine to be repositioned, and splitting the grid (first square for example) into cells allows to obtain discrete positions of this vicinity, rather than using continuous real positions that would unnecessarily increase the computing time and burden the computer memory used. In addition, a more accurate local precision can thus be obtained for repositioning the wind turbines than the positioning obtained in the first arrangement based on the first discrete grid, since the cell discretization can be advantageously finer than that of the first discrete grid. Preferably, the minimum distance is greater than twice the diameter of the turbine rotor and, more preferably, greater than four times the diameter of the turbine rotor,
   b2) calculating the average annual energy production of the predefined number of wind turbines for each possible discrete position of the wind turbine to be repositioned, from the first discrete wind speed distribution, the second discrete wind direction distribution and the probability of occurrence. Of course, to calculate the annual energy production, the wind turbine characteristics are necessary, notably the rotor swept area and the power coefficient. This annual energy production also takes account of the wake effects produced by the turbines, which may induce power losses for the downstream or neighbouring turbines,
   b3) selecting the (discrete) position of the wind turbine to be repositioned corresponding to the calculated maximum value of the annual energy production calculated in step b2),
   b4) defining a new arrangement of the wind turbines in the predetermined space. This new arrangement comprises the modified position of the turbines that have been repositioned and that of the turbines to be repositioned,
  c) determining a final position corresponding to the last arrangement obtained and, once the final arrangement is determined, constructing the wind turbines according to the final arrangement in the predetermined space (the physical site of the predetermined space) to obtain a wind farm for generating energy from wind (in other words, a wind farm is constructed by installing the wind turbines in the positions of the final arrangement in the predetermined space, that is the physical site of the predetermined space, the wind farm being determined to generate energy, electricity for example, from wind).

In other words, step b) is a local search optimization method based on discrete values around the initial position of the wind turbine to be repositioned. Indeed, from the first arrangement obtained in step b), the position of the turbines is modified one by one by looking locally, around the initial position, for discrete positions where the turbine could be positioned (i.e. excluding the discrete positions located at a distance less than another wind turbine and those located outside the boundary or the predetermined space). Local search optimization then consists in evaluating the annual energy produced for each new possible arrangement, that is by keeping the positions of all the wind turbines other than the one to be repositioned and by accounting for each possible discrete position of the turbine to be repositioned.

The position selected is the one that maximizes the annual energy produced. Once the position selected, this position is maintained for the next turbines to be repositioned. In other words, for the continuation of the turbine position modifications, a new arrangement based on the turbine positions that have already been modified is used.

Step c) enables construction of a wind farm with optimization of the turbine position to maximize the total energy recovered by the wind turbines.

Thus, the method of positioning wind turbines or of constructing wind farms in a predetermined space according to the invention uses an optimization based on a purely combinatorial approach.

Steps a) and b) can be carried out by a computer, a mobile phone or a tablet.

According to an embodiment, the annual energy production can be estimated using the following formula:

$$aep = 8760 \cdot E_{w_s, w_y} \{P(f, w_s, w_p)\}$$

where aep is the annual energy production of the wind farm and
$E_{w_s, w_y} \{P(f, w_s, w_p)\}$ is the expectation of the total power produced by the wind farm (by the predefined number of wind turbines in the predetermined space) for each wind speed $w_s$ and each wind direction $w_p$. Therefore, the total power produced by the farm takes account of a statistical distribution of each wind speed $w_s$ in each wind direction $w_p$, by use of a Weibull distribution for example.

In cases where the rotors of the wind turbines are systematically oriented in an orthogonal plane to wind direction $w_p$, the total power produced by the farm can be written as follows:

$$P(f, w_s, w_p) = \sum_{f=1}^{N} P_f(w_s, w_p)$$

where N is the predefined number of wind turbines of the farm in the predetermined space, Pf is the instantaneous power delivered by each turbine f, in the farm, for each wind speed $w_s$ in each wind direction $w_p$.

In cases where some wind turbine rotors are in a plane offset from the orthogonal plane to wind direction $w_p$ (in other words, the wind turbine is not oriented facing the wind, it is offset therefrom), a correction factor can be taken into account to account for the effect of the offset. This correction factor can notably be obtained from CFD (Computational Fluid Dynamics) simulations.

Instantaneous power Pf of each wind turbine f in the farm can be written as follows:

$$P_f(w_s, w_p) = \frac{1}{2} \cdot \rho \cdot S \cdot v_f^3(w_s) \cdot C_{pf}[v_f(w_s)]$$

with $\rho$ being the density of air, S being the area swept by the rotor of turbine f, $v_f(w_s)$ being the wind speed at the rotor of turbine f and $C_{pf}$ being the power coefficient of turbine f depending on wind speed $v_f(w_s)$ at the rotor of turbine f, and power coefficient $C_{pf}$ being a characteristic of turbine f.

Indeed, the wake effects of the wind turbines located upstream from at least one of on the side of turbine f can impact the energy production of turbine f. This wake can generate at least one of a wind speed decrease at turbine f and wind turbulences. The impact of these wake effects is that speed vf at the turbine rotor no longer corresponds to speed ws and that power coefficient Cpf is then also impacted.

The impacts of the wake effects taken into account in the above equation can notably be based on wake models. These wake models can notably indicate:
a wind speed decrease upstream from turbine f due to the wake from an upstream turbine. Such a model, known to the person skilled in the art, is at least one of the Jensen wake model (described in the publication: "A Simple Model for Cluster Efficiency", Katic, Hojstrup and Jensen, EWEC 1986, notably in paragraph 2.1),
an increase in the turbulent intensity of the wind,
and a superposition of wakes of several upstream turbines on a single turbine f, as described in the publication "A Note on Wind Generator Interaction", Jensen, D T U, 1983. This wake superposition can combine the effects of at least one of speed decrease as in the aforementioned publication and/or of turbulent intensity of the wind of several wakes.

The wake models can also be determined from CFD calculations.

Preferably, the sequential order defined is different from the order in which the wind turbines were positioned to obtain the first arrangement, via the greedy algorithm for example. Thus, the optimization precision is improved. Step b) corresponds to a second algorithm for optimizing the position of each wind turbine in the predetermined space.

c) a final arrangement corresponding to the last arrangement obtained is determined. The final arrangement corresponds to the positions of the wind turbines once they have all been repositioned in step b). It therefore represents an optimization of the first arrangement to improve the annual energy produced by the predefined number of turbines in the predetermined space.

Once the final arrangement found, the wind turbines can be constructed according to the final arrangement in the predetermined space so as to obtain a wind farm. The wind farm thus constructed allows maximizing the total energy produced and recovered from the wind in the physical site of the predetermined space.

Advantageously, the predetermined space can be two-dimensional. Thus, the altitude of the ground above sea level is not taken into account. In other words, the variations in altitude difference are ignored for installation of the wind turbines. This allows calculations to be simplified while enabling sufficient precision.

Preferably, the sequential order can be obtained randomly. Indeed, by using a random function for the sequential order, the optimization quality is improved while avoiding optimization paths based on pre-established orders, as such paths may bias the optimization results.

According to an embodiment of the invention, the predetermined number can be the multiple of a square of an integer (preferably, four times the multiple of the square of an integer). Therefore, the discrete position of the wind turbine to be repositioned is in one of the possible discrete positions to be re-evaluated. Indeed, using four times the multiple of a square of an integer enables discretizing the grid in two dimensions by having a first line (vertical for example) of intersection of the cells corresponding to a first axis of symmetry of the grid (of the first square for example) and a second line (horizontal for example) of intersection of the cells corresponding to a second axis of symmetry of the grid.

Therefore, the pre-established number can notably take the following values: 4, 16, 25, 64, 100, etc.

According to a preferred configuration of the invention, step b) can be reiterated several times. Thus, several local search optimization loops for repositioning the wind turbines are performed, which improves the annual energy produced even further.

Preferably, for each iteration of step b), the sequential order of modification of the turbine positions can be modified. Thus, the local repositioning search is improved. When the sequential order is obtained randomly each time, the influence of several optimization paths (an optimization path is understood to be the progressive optimization of the repositioning influenced by the sequential order defined) is avoided. The annual energy produced can thus be increased.

According to an advantageous implementation of the invention, for each iteration of step b), a first predefined length less than the first predefined length of the previous iteration can be selected, the predefined number being the same from one iteration to another, and the iteration of step b) can be stopped when the first predefined length becomes less than a first threshold value. Therefore, upon each iteration of step b), the local vicinity in which it is desired to improve the position of the wind turbine to be repositioned is reduced relative to the preceding iteration. In addition, since the predetermined number is invariant from one iteration to another, discretization of the vicinity is increasingly fine from one iteration to the next. The precision of the turbine position is therefore gradually improved. Defining the first threshold allows stopping iterations at a sufficient level of position precision for turbine installation where no more significant gain can be expected for the annual energy produced (or a gain that would be contained in the calculation uncertainty range). For example, the first threshold can range between 1 m and 10 m, preferably between 4 m and 6 m, so as to obtain a good compromise between computing time, computer memory used, position precision and annual energy production gain.

Advantageously, the predetermined space can comprise non-connex zones. Therefore, the predetermined space can correspond to real locations intended for installing wind turbines, for example a farm planned in a location comprising two zones separated by a road of significant width (several metres or even several tens of metres), such as a motorway.

Preferably, the predetermined space can comprise non-convex zones. Thus, the predetermined zone can correspond to real locations of complex shape, such as a space delimited by a hill or a steep cliff, the coastline, a stream, a river or any other body of water. Offshore, the predetermined space can comprise non-convex zones that may notably be determined by taking into account the underwater depth, the nature of the soil, borders with other countries, navigation channels, cable or pipeline runs for example.

According to an embodiment of the invention, the first positioning algorithm can carry out at least the following steps:
  defining arbitrarily the position of the first wind turbine. Thus, the position of the first turbine is selected in a discrete value of the first discrete grid,
  then, for each wind turbine to be positioned, successively (one by one):
    defining potential positions in the first discrete grid for the wind turbine to be positioned, the potential positions comprising the discrete positions of the first discrete grid located between a minimum distance and a maximum distance (for example, the maximum distance is at least four times the diameter of the wind turbines and preferably at least eight times the diameter of the turbines) from at least one of all the positioned turbines and the discrete positions of the boundary of the predetermined space located at a minimum distance from all the positioned turbines. In other words, positions of the first discrete grid where the next turbine would be advantageously positioned are selected. Therefore, the number of calculations and the computer memory required for defining the selected position are limited, which allows the calculations to be accelerated. In addition, when the discrete values are selected in the positions located between a minimum distance and a maximum distance from the already positioned wind turbines, the chances of positioning a maximum number of turbines in the predetermined space are improved. Positioning as many wind turbines as possible in the predetermined space allows the annual energy production to be improved. Choosing to also position the turbines over the entire boundary located at a minimum distance from the positioned turbines virtually makes it possible to use a larger space than by arranging the turbines strictly within the space, boundaries excluded. Using a larger space allows more energy to be produced,
  calculating the annual energy production of the farm from the positioned wind turbines and the various defined potential positions of the turbine to be positioned. Therefore, an annual energy production value is associated with each defined potential position. In addition, calculation of the annual energy production takes account of the first discrete wind speed distribution, the second discrete wind direction distribution and the probability of occurrence. This calculation involves, as is well known, the wind turbine characteristics, that is at least one of notably the rotor swept area, the drag coefficient and the power coefficient;
  selecting the position of the wind turbine to be positioned corresponding to the maximum annual energy production value calculated in the previous step. This allows maximizing the annual energy produced by the wind turbines whose position is defined in the predetermined space. These defined positions will serve as the basis for determining the position of the next turbine, and notably for defining the potential positions of the first discrete grid;
  determining the first arrangement corresponding to the position of the predefined number of wind turbines in the predetermined space, once all the turbines have been positioned.

Therefore, the first positioning algorithm is a greedy algorithm comprising a step of arbitrary positioning of the first wind turbine, which then iteratively positions an additional turbine in a selected zone of the predetermined space until all the wind turbines of the predefined number are positioned in the predetermined space. This greedy algorithm allows, by use of the step of selecting potential positions, to accelerate the computing time while judiciously positioning the turbines. Such an algorithm allows obtaining a first suitable arrangement for step b) of local positioning optimization for each turbine.

According to a variant of the invention, the arbitrary position can correspond to the largest sum of the coordinates of the positions of the first discrete grid. Thus, the position of the wind turbine is positioned at one end of the predetermined space. This choice allows positioning more turbines in the predetermined space and thereby enables more potential choices regarding the positions of the predefined number of turbines in the predetermined space. There is thus a lot of leeway for optimizing the annual energy produced by the wind farm.

The invention also relates to a computer program product implementing the method as described above from a computer, a mobile phone or a tablet. The computer program product can be at least one of downloadable from a communication network recorded on a computer-readable medium, and a processor or server which executes program code instructions for implementing the method according to one of the above features, when the program is executed on the computer or the mobile phone. Indeed, the method described above is particularly suitable for use with computer. It can thus be implemented in a simple manner and results can be rapidly obtained.

Furthermore, the invention relates to a wind farm obtained from the method of positioning a predefined number of wind turbines in a predetermined space (or of constructing a wind farm) as described above. Indeed, once the wind turbine positioning is obtained, the various turbines can be physically constructed (or installed) in the locations determined by the method in the physical site of the predetermined space. A farm whose total annual energy production is optimized is thus obtained.

FIG. 1 schematically illustrates, by way of non-limitative example, an overall view of the method of positioning a predefined number of wind turbines (or of constructing a wind farm) in a predetermined space according to the invention.

This method notably comprises a first positioning algorithm Alg1. The input data of this first positioning algorithm Alg1 is at least a first discrete distribution RD1 of the wind speed, a second discrete distribution RD2 of the wind direction, a first discrete grid RD3 of the predetermined space in which the predefined number of wind turbines can be installed, and the probability of occurrence Prob of each wind speed in each wind direction. It may also notably use the wind turbine characteristics necessary for determination of the annual energy production.

The wind, speed, direction data and the probability of occurrence of each speed value in each direction can notably be obtained from collectors in a preliminary step. This data can notably be used to obtain known compass rose to the person skilled in the art.

First positioning algorithm Alg1 determines a first arrangement Disp1 of the predefined number of wind turbines in the predetermined space. This first arrangement Disp1 is perfectible, but of sufficient quality to enable local optimizations in the next steps. This first positioning algorithm Alg1 can be a greedy algorithm.

This first arrangement Disp1 rapidly obtains with the greedy algorithm used as input data in a second algorithm Alg2. This second algorithm Alg2 is an optimization algorithm that modifies one by one the position of at least one wind turbine of first arrangement Disp1, and it preferably modifies the position of all the wind turbines of first arrangement Disp1, to increase the annual energy produced by the farm by testing various possible discrete positions for each turbine around the initial position (or the last defined position) thereof.

To determine the annual energy produced, the second algorithm notably uses first discrete wind speed distribution RD1 and second discrete wind direction distribution RD2.

Once all the wind turbines are repositioned, a final arrangement DispF is obtained for the predefined number of wind turbines in the predetermined space. The turbines can then be positioned Pos (constructed/installed/erected) in the physical site corresponding to the predetermined space.

FIG. 2 schematically illustrates, by way of non-limitative example, a detailed view of a first embodiment of the method of positioning a predefined number of wind turbines (or of constructing a wind farm) in a predetermined space according to the invention.

This method notably comprises a first positioning algorithm Alg1. The input data of this first positioning algorithm Alg1 is at least a first discrete distribution RD1 of the wind speed, a second discrete distribution RD2 of the wind direction, a first discrete grid RD3 of the predetermined space in which the predefined number of wind turbines can be installed, and the probability of occurrence Prob of each wind speed in each wind direction. It may also notably use the wind turbine characteristics necessary for determination of the annual energy production. Wake models are used to determine the annual energy produced.

The wind, speed, direction data and the probability of occurrence of each speed value in each direction can notably be obtained from collector in a preliminary step. This data can notably be used to obtain a compass rose known to the person skilled in the art.

First positioning algorithm Alg1 determines a first arrangement Disp1 of the predefined number of wind turbines in the predetermined space. This first arrangement Disp1 is perfectible, but of sufficient quality to enable local optimizations in the next steps. This first positioning algorithm Alg1 can be a greedy algorithm.

This first arrangement Disp1 which is rapidly obtained with the greedy algorithm is used as input data in a second algorithm Alg2. This second algorithm Alg2 is an optimization algorithm that modifies one by one the position of the various wind turbines of first arrangement Disp1, to increase the annual energy produced by the farm by testing various possible discrete positions for each turbine around the initial position thereof.

In more detail, second algorithm Alg2 comprises the following steps:
  defining a sequential order OS for modifying the positions of the turbines one by one. This sequential order OS can notably be obtained by a random function,
  then iteratively modifying the position of at least one wind turbine i, preferably of each turbine i, by carrying out the following substeps:
    determining possible discrete positions PDP_i for wind turbine i, which as discrete positions PDP_i in the vicinity of the position of turbine i to be repositioned (the other wind turbines remaining in their position, either the initial position from the first arrangement, or the already repositioned position). A certain perimeter can for example be defined around the position of the wind turbine to be repositioned (a grid with one or two predetermined lengths, a square whose side has a certain length, a circle of a certain diameter, etc.). Discrete positions are determined in this perimeter for example by splitting this perimeters into cells, and the discrete positions which can then be at least one of the centers of the cells, the intersections of the cells, the points defining the cells, and the discrete positions too close to the other wind turbines are removed from this perimeter. In other words, the discrete positions located at a distance less than a required minimum distance are removed from this perimeter; for example, the required minimum distance can be at least twice the diameter of the turbine rotor. The positions outside the predetermined space are also removed from this perimeter, subsequently evaluating Eval_i the annual energy production for each possible arrangement (for each possible discrete position PDP_i of wind turbine i to be repositioned, the other turbines remaining in the last position assigned thereto). The annual energy produced accounts for the first and second discrete distributions RD1 and RD2 of the wind speeds and directions, as well as the probability of occurrence Prob of each wind speed in each wind direction. Thus, at the end of this evaluation step, an annual energy production corresponds to each possible discrete position PDP_i of wind turbine i to be repositioned, selecting as position Pos_i of wind turbine i the possible discrete position PDP_i that corresponds to the maximum value of the annual energy production in step Eval_i, thus obtaining a new arrangement Disp_N for the wind turbines in the predetermined space. This new arrangement comprises the last positions of the already positioned turbines and the new position Pos_i of wind turbine i.

Loop B1 then allows selecting F1 which is the next wind turbine of the defined sequential order (i becomes i+1) in order to carry out the same procedure for the next turbines.

Once all the wind turbines are repositioned, a final arrangement DispF is obtained for the predefined number of wind turbines in the predetermined space. The turbines can then be positioned Pos (i.e. physically constructed, installed or erected) in the physical site corresponding to the predetermined space.

FIG. 3 schematically illustrates, by way of non-limitative example, a variant of FIG. 2. References identical to those of FIG. 2 correspond to the same elements and are therefore not detailed again here.

FIG. 3 differs from FIG. 2 by the addition of a second loop B2 in second algorithm Alg2.

Indeed, once all the wind turbines have been repositioned by loop B1, it is planned here to modify several times the position of these turbines. Therefore, the steps of determining sequential order OS and loop B1 are reiterated several times for each wind turbine, so that one by one, loop B1 comprises, for each turbine i to be repositioned, determination of the possible discrete positions PDP_i, evaluation of the annual energy produced Eval_i for each possible discrete position, selection of the position Pos_i of wind turbine i to be repositioned and definition of the new arrangement Disp_N.

Reiterating these steps several times allows refining the positions of the wind turbines in the predetermined space and improving the annual energy produced by the farm. Modifying each time the sequential order (each time by random draw for example) allows improving the annual energy production even further.

Loop B2 can end for example when the annual energy gain relative to the previous iteration is below a certain value, below 0.5% for example.

Once loop B2 is completed, the last arrangement obtained Disp_N becomes the final arrangement DispF and the wind turbines can then be positioned Pos (constructed/erected/installed) in the planned positions according to final arrangement DispF in order to obtain a wind farm.

FIG. 4 schematically illustrates, by way of non-limitative example, a predetermined space suited for implementing the positioning method according to the invention (or the method of constructing a wind farm according to the invention).

The predetermined space can notably comprise a first zone Z1 and a second zone Z2 represented by vertical hatchings. These zones Z1 and Z2 are non-connex. Indeed, there is a non-zero minimum distance D between zones Z1 and Z2. In addition since zone Z1 is rectangular, it is therefore convex. Zone Z2 has a complex, non-convex shape. Indeed, if one considers the two points A and B, it appears that a part of segment Seg connecting points A and B is outside zone Z2.

To identify zones Z1 and Z2 of the predetermined space in a third, larger zone ZE encompassing these two zones Z1 and Z2, a Boolean matrix can be used. Third zone ZE is of rectangular shape, which is easier to process digitally than at least one of non-connex and non-convex zones such as Z1 and Z2. The Boolean matrix associates with each discrete value (discrete position) of zone ZE a value equal to 1 if the discrete position is in zone Z1 or Z2 and a value 0 if it is outside Z1 and Z2. This Boolean matrix allows to define the predetermined space used for the method. The boundary or the boundaries of the predetermined space can be determined from this Boolean matrix. Indeed, a point will be considered to belong to the boundary if its value in the Boolean matrix is 1 and if it has, among its direct neighbours, at least one point with a value in the Boolean matrix equal to 0.

FIG. 5 schematically illustrates, by way of non-limitative example, a first positioning algorithm according to the invention.

This first positioning algorithm is a greedy algorithm.

From the first discrete grid RD3 of the predetermined space, the position of the first wind turbine P_E1 is defined, arbitrarily for example.

Then, for each wind turbine j, a position is sought to maximize the annual energy produced.

Thus, iteratively according to F3, for each wind turbine, one by one, potential positions PE_Ej are defined for turbine j to be positioned, potential positions PE_Ej being delimited by first discrete grid RD3 of the predetermined space. For example, the potential positions can correspond to the positions of first discrete grid RD3 located between a minimum distance and a maximum distance from the wind turbines already positioned in the predetermined space and/or to the corresponding positions at the boundary of the predetermined space.

Once these potential positions PE_Ej are defined for wind turbine j to be positioned, the annual energy production of the already positioned turbines and of turbine j to be positioned in the predetermined space is evaluated with Eval_AEP for each of these potential positions PE_Ej. For this evaluation Eval_AEP, the first and second distributions RD1 and RD2 of the wind speeds and directions are notably used, as well as the probability of occurrence Prob of each wind speed in each wind direction. The characteristics of the wind turbines and the wake effects described above can be used in a known manner.

The position Pos_j of wind turbine j can then be selected, which corresponds to the maximum value of the annual energy production of the previous step.

A new arrangement Disp_Ej of the wind turbines (including turbine j) positioned in the predetermined space can then be defined. This new arrangement Disp_Ej will be used in the next iteration to determine the potential positions PE_Ej of the new wind turbine to be positioned and to evaluate the annual energy produced Eval_AEP.

Loop F3 is performed, j ranging from 1 to N−1, N being the predefined number of wind turbines in the predetermined space, considering that the first turbine is positioned stepwise in P_E1.

Once all the wind turbines is positioned (i.e. when j=N−1), the last arrangement found Disp_Ej then corresponds to first arrangement Disp1. A wind farm can then be constructed by installing (erecting/constructing) the wind turbines in the positions of the last arrangement found, corresponding to the final arrangement, to produce energy from wind in the physical site of the predetermined space.

FIG. 6 schematically illustrates, by way of non-limitative example, the steps of positioning the first three wind turbines by a greedy positioning algorithm. Diagrams a), b) and c) respectively correspond to the positioning steps of the first, the second and the third turbine.

The predetermined space Esp defined here is rectangular. First wind turbine E1 is arbitrarily positioned in the lower right corner of the rectangle of predetermined space Esp. Thus, first wind turbine E1 is positioned on the boundary of predetermined space Esp.

Once this wind turbine is positioned, the potential positions for determining the position of the second wind turbine PE-E2 correspond to the discrete values located on the boundary of predetermined space Esp located at a greater distance than a minimum distance from first wind turbine E1 and the discrete values located in predetermined space Esp located at a distance ranging between the minimum distance and a maximum distance. Here, the minimum distance is twice the diameter of the turbine rotor and the maximum distance is four times the diameter of the turbine rotor.

Once the annual energy production calculated for each position PE_E2, the position of second wind turbine E2 is determined in the position located in diagram b). The second wind turbine thus is on the boundary of predetermined space Esp.

These positions of the first two wind turbines allows defining the potential positions PE_E3 for the third turbine to be positioned. These potential positions PE_E3 comprise the discrete positions located in the predetermined space between the minimum distance and the maximum distance from the already positioned wind turbines (first and second turbines E1 and E2), as well as the discrete positions located on the boundary of predetermined space Esp at a greater distance than the minimum distance from wind turbines E1 and E2.

Once the annual energy production is calculated for each position PE_E3, the position of third wind turbine E3 is determined in the position located in diagram c). The third wind turbine thus is also on the boundary of predetermined space Esp.

These positions of the first three wind turbines allow defining the potential positions PE_E4 of the fourth wind turbine to be positioned. These potential positions PE_E4 comprise the discrete positions located in the predetermined space between the minimum distance and the maximum distance from the already positioned turbines (turbines E1, E2 and E3). It is noted that there is no discrete position on the boundary of predetermined space Esp at a greater distance than the minimum distance from wind turbines E1, E2 and E3, outside the previously defined zones because all the other values of the boundary no longer meet the conditions of minimum distance from wind turbines E1 to E3.

FIG. 7 schematically illustrates, by way of non-limitative example, a variant of the steps of positioning the first three wind turbines by a first greedy positioning algorithm. Diagrams a), b) and c) respectively correspond to the steps of positioning the first, the second and the third turbine.

FIG. 7 differs from FIG. 6 in that the potential positions are defined only by the discrete values of the space located between the minimum distance and the maximum distance from the already positioned wind turbines The discrete values located on the boundary of the predetermined space at a greater distance than the maximum distance from the already positioned turbines are in addition no longer are taken into account.

Predetermined space Esp defined here is rectangular. First wind turbine E1 is arbitrarily positioned in the lower right corner of the rectangle of predetermined space Esp. Thus, first wind turbine E1 is positioned on the boundary of predetermined space Esp.

Once this wind turbine is positioned, the potential positions for determining the position of the second wind turbine PE_E2 correspond to the discrete values located in predetermined space Esp (including the boundary) at a distance ranging between the minimum distance and a maximum distance. Here, the minimum distance is twice the diameter of the turbine rotor and the maximum distance is four times the diameter of the turbine rotor.

Once the annual energy production is calculated for each position PE_E2, the position of second wind turbine E2 is determined in the position located in diagram b). The second wind turbine is therefore not on the boundary of predetermined space Esp, unlike the solution of diagram b) in FIG. 6, whereas the predetermined space is identical, and the first and second discrete distributions and the first discrete grid are identical, the probabilities of occurrence are identical and the position of first wind turbine E1 is identical.

These positions of the first two wind turbines allow defining the potential positions PE_E3 of the third turbine to be positioned. These potential positions PE_E3 comprise the discrete positions located in the predetermined space between the minimum distance and the maximum distance from the already positioned turbines (the first and the second turbine, E1 and E2).

Once the annual energy production is calculated for each position PE_E3, the position of third wind turbine E3 is determined in the position located in diagram c).

These positions of the first three wind turbines E1 to E3 allow defining the potential positions PE_E4 of the fourth wind turbine to be positioned. These potential positions PE_E4 comprise the discrete positions located in the predetermined space between the minimum distance and the maximum distance from the already positioned wind turbines (turbines E1, E2 and E3).

It is noted that the positions of the three wind turbines E1, E2 and E3 of FIG. 7 are very different from those of FIG. 6, while all the parameters are identical. The distinction is only linked to the definition of the potential positions that involve (FIG. 6) or not (FIG. 7) with the discrete positions of the boundary of predetermined space Esp located at a greater distance than the maximum distance of all the already positioned wind turbines.

The advantage of the solution of FIG. 7 in relation to FIG. 6 is that the positioning of the wind turbines, one after the other, allows the turbines to be positioned closer to one another, which thereby allows more wind turbines to be positioned in the predetermined space. This is particularly interesting when there is a significant predefined number of wind turbines in a limited predetermined space (in proportion to the predefined number of wind turbines to be positioned).

FIG. 8 schematically illustrates, by way of non-limitative example, an application of a local optimization model for positioning a wind turbine from a first arrangement.

This figure shows four diagrams a), b), c) and d) illustrating different turbine repositioning steps.

The wind turbine positioning (or wind farm construction) method applied here corresponds to FIG. 3.

Diagram a) shows a first arrangement of five wind turbines represented by small circles in a predetermined space Esp defined by the grey rectangle.

The position of turbine Eol is to be improved. A first grid Car1 is therefore defined, the grid being here a square centered on turbine Eol and of side L1.

In diagram b), grid Car1 is discretized into sixteen (it could however be a different number, notably four, twenty-five, a hundred, etc.) cells Car2, here cells Car2 are second squares of smaller side than grid Car1 to discretize grid Car1. The possible discrete positions PDP_i are defined as the points of intersection of cells Car2. Possible discrete positions PDP_i are represented by crosses positioned at the points of intersection of the cells in predetermined space Esp and at a sufficient distance from the other wind turbines. In diagram b), three discrete positions PDP_i are possible. Thus, after local optimization of the annual energy in the three possible positions PDP_i, the position of wind turbine Eol changes from position P_init to position P_modif1.

Once all the wind turbines are repositioned, step b) of the positioning (or wind farm construction) method can be reiterated.

A new grid (new first square) of side L2 smaller than side L1 used in the previous iteration is then redefined. This new grid, which is centered around position P_modif1, is again discretized in the pre-established number of cells (sixteen second squares here) and new possible discrete positions are defined, which correspond to the crosses positioned at the points of intersection of the cells located in predetermined space Esp and at a sufficient distance from the other wind turbines. It is noted that the points of intersection Pexc are located too close to turbine Eol2 (their distance to turbine Eol2 is less than the minimum distance). They are therefore not taken into account in the possible discrete positions for repositioning turbine Eol. After this new iteration, the position of turbine Eol is in position P_modif2.

Once all the wind turbines are repositioned by step b) of the positioning (or wind farm construction) method can be iterated again.

In diagram d), a new local search for repositioning wind turbine Eol is performed. A new grid (a new first square) centered on position P_modif2, of side L3 smaller than side L2, is redefined. The new grid is discretized into the pre-established number (identical to the grids of the previous iterations) of cells (sixteen second squares here). On these sixteen cells, sixteen points of intersection are located in predetermined space Esp and at a sufficient distance from the other wind turbines (at a greater distance than the minimum distance from the other turbines). They then serve as possible discrete positions represented by the crosses for repositioning wind turbine Eol.

Calculation of the annual energy based on the position of wind turbine Eol in these different possible discrete positions allows defining the position P_modif3 corresponding to the maximum annual energy production.

It is noted that, for diagrams c) and d), the positions of the wind turbines other than Eol are unchanged, but they could be changed, considering that diagrams c) and d) correspond to new iterations of step b) wherein a new turbine arrangement is established as input for the new iteration.

FIG. 9 schematically illustrates, by way of non-limitative example, several steps of the method for positioning a pre-established number of wind turbines (or for construction of a wind farm) in a predetermined space Esp.

Predetermined space Esp has a rectangular shape here.

Diagram a) shows a first arrangement of five wind turbines, represented by dark grey points, in predetermined space Esp. This first arrangement is obtained from a first greedy algorithm such as that of FIG. 7.

In diagram b), it is sought to improve the position of wind turbine El1 to increase the produced annual energy. This is achieved by determining a grid (first square) centered on the position of turbine El1, and this grid is discretized into a pre-established number of cells (second squares for example) whose points of intersection located in predetermined space Esp and at a sufficient distance from the other turbines (at a greater distance than the minimum distance from the other turbines, the minimum distance being for example twice the diameter of the turbine rotor) correspond to the possible discrete positions, represented by small grey points around wind turbine El1.

Diagram c) corresponds to a new iteration of step b). The arrangement of the wind turbines has been modified in this new iteration. Indeed, at the end of an iteration of step b), the wind turbines have been repositioned one after the other.

In diagram c), the goal is to reposition wind turbine El2. This is achieved by determining a grid (first square) centered on the position of turbine El2 and this grid is discretized into a pre-established number of cells (second squares here). The intersections of these cells located in predetermined space Esp, is at a greater distance than the minimum distance to the other turbines (twice the diameter of the turbine rotor for example), which corresponds to the possible discrete positions for wind turbine El2. These possible discrete positions correspond to the small light grey points around turbine El2.

FIG. 10 schematically illustrates, by way of non-limitative example, an application of the method of positioning wind turbines (or of constructing a wind farm) in a complex predetermined space.

The predetermined space here has two non-connex zones Es1 and Es2. In addition, zone Es2 is non-convex, considering the triangle-shaped part of boundary Ar oriented towards the inside of zone Es2.

In diagram a), the grey points represent the boundary of the predetermined space and they correspond to the discrete locations where the first wind turbine can be installed.

In diagram b), a single wind turbine EE1 is positioned and materialized by the grey isolated point, at the top of zone Es1. The clusters of dark grey points T2 represent the potential positions of the next turbine to be positioned in the predetermined space. They correspond to the discrete points of the boundaries of zones Es1 and Es2 located at a sufficient distance (i.e. greater than a minimum distance that may be twice the turbine diameter) from turbine EE1, and to the discrete positions within zone Es1 located at a distance ranging between a minimum distance and a maximum distance from turbine EE1.

Diagram c) corresponds to a step where 20 wind turbines, represented by the grey isolated points, have been positioned by the first greedy positioning algorithm. The clusters of dark grey points T21 correspond to the potential positions for the 21ST wind turbine to be positioned by the first greedy positioning algorithm.

Diagram d) corresponds to a step where 50 wind turbines, materialized by the grey isolated points, have been positioned by the first greedy positioning algorithm. The clusters of dark grey points T51 correspond to the potential positions for the 51ST wind turbine to be positioned by the first greedy positioning algorithm.

Diagram e) corresponds to a step wherein the position of a wind turbine ELi is to be improved through a local optimization of the position thereof. The arrangement of the 52 wind turbines has been previously established by the first greedy positioning algorithm, and the current positions of each of the 52 turbines correspond to the large grey isolated points of diagram e).

The smaller grey points positioned around wind turbine ELi are the possible discrete positions PDP_ELi for repositioning turbine ELi. The annual energy productions are estimated based on the positions of the wind turbines other than turbine ELi in the arrangement of diagram e) and on the various possible discrete positions PDP_ELi for turbine ELi.

FIG. 11 schematically illustrates, by way of non-limitative example, a variant of the positioning (or wind farm construction) method for the predetermined complex space, identical to that of FIG. 10.

The predetermined space comprises two non-connex zones Es1 and Es2. In addition, zone Es2 is non-convex, considering the triangle-shaped part of boundary Ar oriented towards the inside of zone Es2.

For positioning of the wind turbines by the first greedy positioning algorithm, the potential positions correspond to the discrete positions located in the predetermined space at a distance ranging between a minimum distance and a maximum distance from the already positioned wind turbines. The points of the boundary located at a greater distance than the maximum distance to the already positioned turbines are not taken into account in order to maximize the number of turbines to be installed in the predetermined space, whereas they have been accounted for in the first positioning algorithm of FIG. 10, as can be seen in diagram b) of FIG. 10, by the potential positions T2 of the second turbine.

Two wind turbines EE1 and EE2 are positioned in diagram a) of FIG. 11. The potential positions of the third turbine T3 to be positioned correspond to the clusters of grey points.

In diagram b) of FIG. 11, 10 wind turbines materialized by the grey isolated points have been positioned. The potential positions of the 11th turbine T11 to be positioned correspond to the clusters of grey points.

EXAMPLES

A first example positions the wind turbines in the predetermined space of FIG. 7, according to a continuous method (using continuous real data instead of discrete values) of the prior art and according to the method of FIG. 3 of the invention, where the possible discrete positions are defined from a grid (first square) centered on the position of the wind turbine to be repositioned, the grid being discretized into a pre-established number of cells (second squares here), and the intersections of the cells positioned in the predetermined space and at a sufficient distance (greater than a minimum distance) from the other wind turbines form the possible discrete positions.

The wind turbines to be installed are 2.5 MW turbines, and the minimum distance between the turbines is 4 times the diameter of the turbine rotors.

For the method according to the invention, the maximum distance between the wind turbines used for the first greedy positioning algorithm is 8 times the diameter of the turbine rotor. The length of the first square of the first iteration is 500 m, the threshold allowing the iterations of step b) to be stopped is 5 m, the pre-established number is 4, and the ratio of the length of a first square to the length of the first square of the previous iteration of step b) is 0.8.

The method according to the prior art is implemented with the FarmShadow™ software (IFP Energies nouvelles, France).

The first wind speed distribution comprises discrete values with spacing of 0.5 m/s and the second wind direction distribution comprises discrete values with spacing of 1°.

The method according to the invention allows estimation of a gain of approximately 2.2% on the annual energy produced relative to the method of the prior art, which shows the efficiency of the method for improving the energy recovered by the farm while reducing the computing time and the computer memory used.

The second application example relates to FIG. 10. First of all, this application comprising a predetermined space with non-connex and non-convex zones is not applicable with a continuous method, which requires a convex and connex zone to be applied, generally of rectangular shape. 52 10-MW wind turbines have been positioned in this predetermined space.

The annual energy production gain obtained with the final wind turbine arrangement, relative to the first arrangement obtained from the first greedy positioning algorithm, is approximately 2.84%. This testifies, on the one hand, to the good first arrangement obtained from the first algorithm and, on the other side, to the efficiency of the local search method of optimizing the position of each wind turbine.

The method of positioning wind turbines in a predetermined space (or of constructing a wind farm) allows fast and simple calculations while providing a precise and optimized position for the turbines in a predetermined space, a predetermined space that may be non-connex and/or non-convex so as to maximize the total annual energy produced by the wind farm.

The invention claimed is:

1. A method for constructing a wind farm in a space from a predefined number of wind turbines, the method comprising a first discrete wind speed distribution, a second discrete wind speed distribution and a probability of occurrence of a discrete wind speed for a wind direction of each of the first and second discrete wind speed distributions, the space being split into a first discrete grid, comprising steps:
   a) determining a first arrangement of the wind turbines in the first discrete grid of the space by a first positioning algorithm;
   b) defining a sequential order of modification of wind turbine positions determined by the first positioning algorithm, then carrying out steps iteratively, for at least one wind turbine to be repositioned, one by one, in a defined sequential order:
   b1) determining, for each wind turbine to be repositioned, new possible discrete positions of the turbine to be repositioned, by developing a grid of at least a first predefined length, the grid being centered on the position of the turbine to be repositioned, the grid being split into a pre-established number of cells, the new possible discrete positions comprising points of intersection of the cells, points of intersection of the cells being positioned in the space and at a minimum distance spaced from positions of other wind turbines;
   b2) calculating an average annual energy production of the predefined number of wind turbines for each possible discrete position of the wind turbine to be repositioned, from the first discrete wind speed distribution, the second discrete wind speed distribution and the probability of occurrence of each discrete wind speed distribution;

b3) selecting the position of the wind turbine to be repositioned corresponding to a maximum value of an annual energy production calculated in step b2);

b4) defining a new arrangement for the wind turbines at the space; and c) determining a final position corresponding to a last arrangement obtained, and constructing the wind farm by erecting the wind turbines in the positions of the final arrangement in the site of the space to generate energy from the wind.

2. A wind farm construction method as claimed in claim 1, wherein, prior to step a), statistical wind data is collected by a collection device, in the space to determine first and second discrete distributions, and the probabilities of occurrence of each wind speed in each wind direction of the first and second discrete distributions.

3. A wind farm construction method as claimed in claim 2, wherein the space is two-dimensional.

4. A wind farm constructed by using the method of claim 3.

5. A wind farm construction method as claimed in claim 2, wherein the sequential order is randomly obtained.

6. A wind farm constructed by using the method of claim 5.

7. A wind farm construction method as claimed in claim 2, wherein the space comprises connex zones.

8. A wind farm constructed by using the method of claim 2.

9. A wind farm construction method as claimed in claim 1, wherein the space is two-dimensional.

10. A wind farm construction method as claimed in claim 9, wherein the sequential order is randomly obtained.

11. A wind farm constructed by using the method of claim 9.

12. A wind farm construction method as claimed in claim 1, wherein the sequential order is randomly obtained.

13. A wind farm constructed by using the method of claim 12.

14. A wind farm construction method as claimed in claim 1, wherein step b) is reiterated multiple times, by modifying a sequential order upon each iteration.

15. A wind farm construction method as claimed in claim 14, wherein for each iteration of step b), a first predefined length, less than, the first predefined length of the previous iteration, is selected, the pre-established number of cells being the same from one iteration to another, and the iteration of step b) is stopped when the first predefined length becomes less than a first threshold value.

16. A wind farm construction method as claimed in claim 1, wherein the space comprises connex zones.

17. A wind farm construction method as claimed in claim 1, wherein the first positioning algorithm performs at least steps of:

arbitrarily defining a position of the first wind turbine;

then, for each wind turbine to be positioned successively:

defining potential positions in the first discrete grid for the wind turbine to be positioned, the potential positions comprising at least one of the positions of the first discrete grid located between a minimum distance and a maximum distance from all positioned turbines and the discrete positions of a boundary of the space be located at the minimum distance from all positioned turbines;

calculating annual energy production of the positioned wind turbines and of the turbines to be positioned for potential positions defined, from the first discrete wind speed distribution, the second discrete wind speed distribution and the probability of occurrence;

selecting the position of the wind turbine to be positioned corresponding to a calculated maximum annual energy production; and determining the first arrangement corresponding to a position of the predefined number of wind turbines in the space.

18. A wind farm construction method as claimed in claim 17, wherein the defined arbitrary position corresponds to a largest sum of the coordinates of positions of the first discrete grid.

19. An executable computer program product, and a server, comprising program code instructions for implementing the method of claim 1, wherein the program is executed on a computer or a mobile phone.

20. A wind farm constructed by using the method of claim 1.

* * * * *